United States Patent
Song et al.

(10) Patent No.: US 11,217,773 B2
(45) Date of Patent: Jan. 4, 2022

(54) DISPLAY DEVICE INCLUDING AN ENCAPSULATION STRUCTURE

(71) Applicant: SAMSUNG DISPLAY CO., LTD., Yongin-si (KR)

(72) Inventors: Hyungue Song, Yongin-si (KR); Heeseong Jeong, Yongin-si (KR); Sunhwa Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/822,437

(22) Filed: Mar. 18, 2020

(65) Prior Publication Data
US 2020/0381665 A1    Dec. 3, 2020

(30) Foreign Application Priority Data

May 27, 2019  (KR) .......................... 10-2019-0062056

(51) Int. Cl.
*H01L 29/08* (2006.01)
*H01L 51/52* (2006.01)

(52) U.S. Cl.
CPC .... *H01L 51/5256* (2013.01); *H01L 2251/303* (2013.01)

(58) Field of Classification Search
CPC ............. H01L 51/5012; H01L 51/5253; H01L 27/3246; H01L 27/3244
See application file for complete search history.

(56) References Cited

U.S. PATENT DOCUMENTS

| 9,692,018 | B2 | 6/2017 | Cho et al. |
| 2005/0231103 | A1* | 10/2005 | Kim ...................... H01L 51/529 |
| | | | 313/504 |
| 2014/0138836 | A1 | 5/2014 | Song |
| 2017/0125497 | A1 | 5/2017 | Kim et al. |
| 2017/0125505 | A1 | 5/2017 | Oh |
| 2018/0013100 | A1 | 1/2018 | Yim et al. |
| 2018/0069070 | A1* | 3/2018 | Lee ..................... H01L 51/5284 |
| 2018/0219183 | A1 | 8/2018 | Song |
| 2019/0043931 | A1 | 2/2019 | Yim et al. |
| 2019/0165080 | A1* | 5/2019 | Ito ........................ G09G 3/3225 |
| 2019/0198810 | A1 | 6/2019 | Song et al. |

FOREIGN PATENT DOCUMENTS

| KR | 10-2016-0031108 | 3/2016 |
| KR | 10-2017-0052757 | 5/2017 |
| KR | 10-2018-0005772 | 1/2018 |
| KR | 10-2019-0015682 | 2/2019 |

* cited by examiner

*Primary Examiner* — Phuc T Dang
(74) *Attorney, Agent, or Firm* — F. Chau & Associates, LLC

(57) ABSTRACT

A display device includes a substrate. A display element is disposed over the substrate. A first inorganic encapsulation layer is disposed on the display element. An organic encapsulation layer is disposed on the first inorganic encapsulation layer. An auxiliary layer is disposed between the first inorganic encapsulation layer and the organic encapsulation layer. The auxiliary layer has a thickness less than about 100 nm, and includes an inorganic insulating material. A second inorganic encapsulation layer is disposed on the organic encapsulation layer.

20 Claims, 11 Drawing Sheets

DISPLAY DEVICE INCLUDING AN ENCAPSULATION STRUCTURE

CROSS-REFERENCE TO RELATED APPLICATION

This application claims priority to and the benefit of Korean Patent Application No. 10-2019-0062056, filed on May 27, 2019, in the Korean Intellectual Property Office, the disclosure of which is incorporated by reference herein in its entirety.

TECHNICAL FIELD

The present disclosure relates to a display device and, more particularly, to a display device including an encapsulation structure.

DISCUSSION OF RELATED ART

Display devices have been incorporated into a wide variety of electronic devices. This has led to the development of display devices in a range of different sizes and shapes. As display technology has evolved, display devices have become thinner and more light weight. As display devices are now being used in a wide variety of different conditions, attention has been paid to making display devices more rugged and able to endure all manners of adverse conditions and circumstances. However, protective structures of the display devices should ideally not interfere with display quality.

SUMMARY

A display device includes a substrate. A display element is arranged over the substrate. A first inorganic encapsulation layer is arranged on the display element. An organic encapsulation layer is disposed on the first inorganic encapsulation layer. An auxiliary layer is arranged between the first inorganic encapsulation layer and the organic encapsulation layer. The auxiliary layer has a thickness less than about 100 nm, and includes an inorganic insulating material. A second inorganic encapsulation layer is disposed on the organic encapsulation layer.

A thickness t of the auxiliary layer may be within a range of 30 nm≤t≤100 nm.

A thickness T of the first inorganic encapsulation layer may be within a range of 600 nm≤T≤2200 nm.

The auxiliary layer may directly contact a top surface of the first inorganic encapsulation layer, and a refractive index n3 of the auxiliary layer may meet the condition below:

$$\min(n1,n2)+|n2-n1|\times 0.25 < n3 < \min(n1,n2)+|n2-n1|\times 0.75,$$

where n1 is a refractive index of the first inorganic encapsulation layer, n2 is a refractive index of the organic encapsulation layer, min(n1, n2) is a minimum value of n1 and n2, and |n2−n1| is an absolute value of a difference between n2 and n1.

The first inorganic encapsulation layer and the auxiliary layer each may include a non-metal element. A non-metal element included in the first inorganic encapsulation layer may be the same as a non-metal element included in the auxiliary layer.

The first inorganic encapsulation layer and the auxiliary layer each may include silicon oxynitride, and a refractive index of the first inorganic encapsulation layer may be different from a refractive index of the auxiliary layer.

The organic encapsulation layer may directly contact a top surface of the auxiliary layer.

The display device may further include a bottom layer arranged between the auxiliary layer and the organic encapsulation layer.

A difference between a refractive index of the bottom layer and a refractive index of the organic encapsulation layer may be less than about 0.05.

The bottom layer may include an inorganic insulating material.

The bottom layer may include a non-metal element that is the same as that of the auxiliary layer.

The bottom layer and the auxiliary layer may include an inorganic insulating material including a silicon element, a nitrogen element, and an oxygen element. An oxygen content of the bottom layer may be greater than an oxygen content of the auxiliary layer.

A display device includes a substrate. A plurality of organic light-emitting diodes is arranged over the substrate. A first inorganic encapsulation layer covers the plurality of organic light-emitting diodes. A second inorganic encapsulation layer is disposed over the first inorganic encapsulation layer. An organic encapsulation layer is disposed between the first inorganic encapsulation layer and the second inorganic encapsulation layer. An auxiliary layer is arranged between the first inorganic encapsulation layer and the organic encapsulation layer. A thickness of the auxiliary layer is less than a thickness of the first inorganic encapsulation layer and the auxiliary layer meets a condition below:

30 nm≤t<100 nm, where t is a thickness of the auxiliary layer.

A thickness T of the first inorganic encapsulation layer may be within a range of 600 nm≤T≤2200 nm.

The first inorganic encapsulation layer, the auxiliary layer, the second inorganic encapsulation layer each may include an inorganic insulating material including a non-metal element.

A refractive index n3 of the auxiliary layer may meet the condition below:

$$\min(n1,n2)+|n2-n1|\times 0.25 < n3 < \min(n1,n2)+|n2-n1|\times 0.75,$$

where n1 is a refractive index of the first inorganic encapsulation layer, n2 is a refractive index of the organic encapsulation layer, min(n, n2) is a minimum value of n1 and n2, and |n2−n1| is an absolute value of a difference between n2 and n1.

A non-metal element included in the first inorganic encapsulation layer may be the same as a non-metal element included in the auxiliary layer, and a refractive index of the auxiliary layer may be less than a refractive index of the first inorganic encapsulation layer.

The auxiliary layer may directly contact the first inorganic encapsulation layer and the organic encapsulation layer.

The display device may further include a bottom layer arranged between the auxiliary layer and the organic encapsulation layer. A difference between a refractive index of the bottom layer and a refractive index of the organic encapsulation layer being less than about 0.05.

The bottom layer may include an inorganic insulating material and may directly contact the auxiliary layer and the organic encapsulation layer.

BRIEF DESCRIPTION OF THE DRAWINGS

A more complete appreciation of the present disclosure and many of the attendant aspects thereof will be readily obtained as the same becomes more apparent from the following description taken in conjunction with the accompanying drawings, in which.

DETAILED DESCRIPTION

Figure 1:
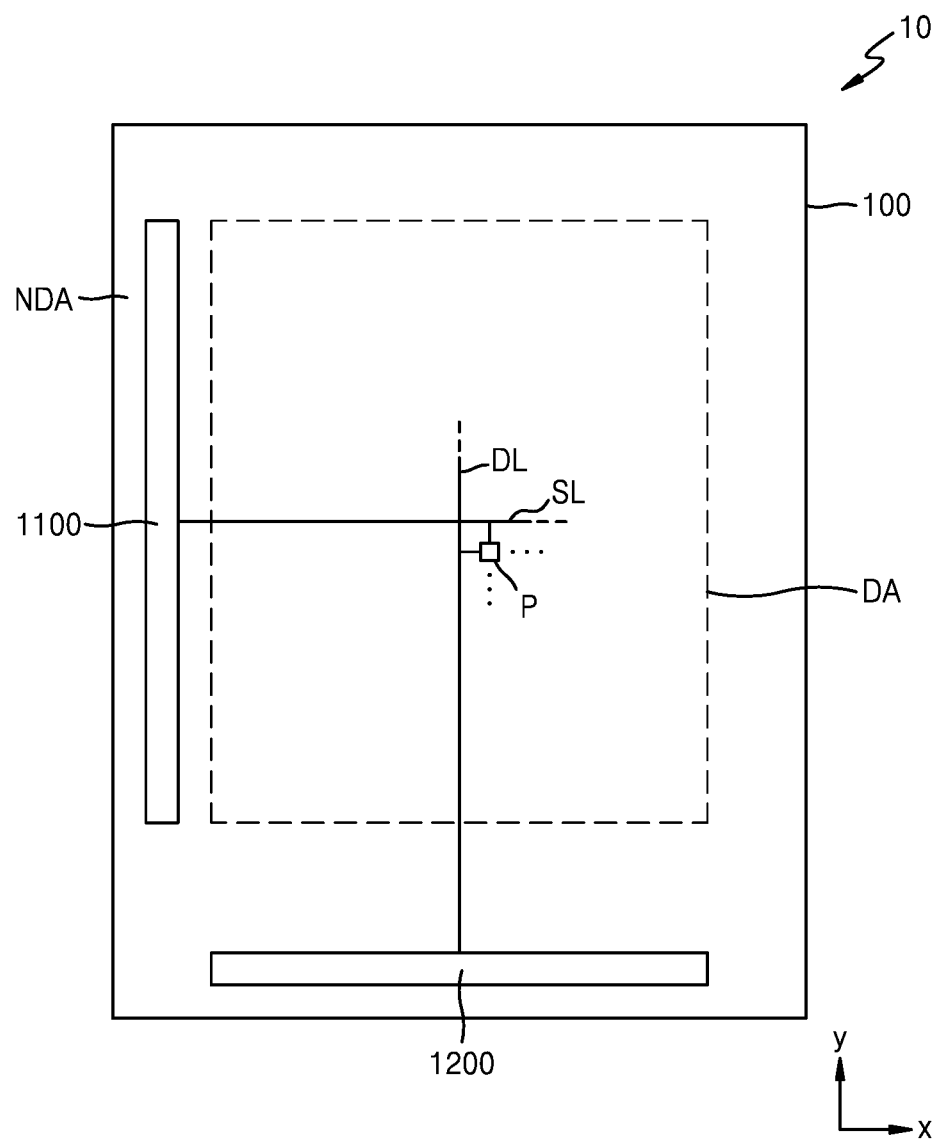
FIG. 1 is a plan view illustrating a display device according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Like reference numerals in the drawings and specification may denote like or corresponding elements, and to the extent that repeated description has been omitted, it may be assumed that the omitted description is at least similar to that of corresponding elements that are described elsewhere in the specification.

It will be understood that although the terms "first", "second", etc. may be used herein to describe various components, these components should not be limited by these terms. These components are only used to distinguish one component from another.

It will be further understood that the terms "comprises/includes" and/or "comprising/including" used herein specify the presence of stated features or components, but do not preclude the presence or addition of one or more other features or components. However, the phrase, "consisting of" are used herein to preclude the presence or addition of other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. While the lengths, angles, thicknesses, and relative dispositions of the various elements shown in the figures may be interpreted as details pertaining to a particular example, it may be understood that changes may be made to these values without departing from the spirit or scope of the present disclosure.

It is to be understood that the elements described herein with respect to particular embodiments may be re-combined to form different embodiments and the steps described herein may be rearranged to be performed in a different order and one or more of the described steps may be performed substantially simultaneously. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view illustrating a display device 10 according to an exemplary embodiment of the present disclosure.

Referring to FIG. 1, the display device 10 may include a display area DA and a non-display area NDA that at least partially surrounds the display area DA. The display device 10 includes a plurality of pixel areas P arranged therein. A display element emitting light of a predetermined color may be arranged in each of the pixel areas P. The display element may be connected to a scan line SL and a data line DL. The display area DA and the non-display area NDA may each be a portion of a substrate 100 of the display device 10. For example, it may be understood that the substrate 100 includes the display area DA and the non-display area NDA.

A scan driver 1100, a data driver 1200, and a main power line may be arranged in the non-display area NDA. The scan driver 1100 provides a scan signal to each pixel area P through a scan line SL. The data driver 1200 provides a data signal to each pixel area P through a data line DL. The main power line provides a first power voltage and a second power voltage.

Though it is shown in FIG. 1 that the data driver 1200 is arranged on the substrate 100, the data driver 1200 may be arranged on a flexible printed circuit board (FPCB) electrically connected to a pad arranged on one side of the display device 10.

The display device 10, according to an exemplary embodiment of the present disclosure, may include an organic light-emitting display, an inorganic light-emitting display, and a quantum dot display. Though a display device, according to an exemplary embodiment of the present disclosure, is described as being an organic light-emitting display device as an example, a display device according to the present disclosure is not limited thereto and characteristics described below are applicable to various types of display devices.

Figure 2:
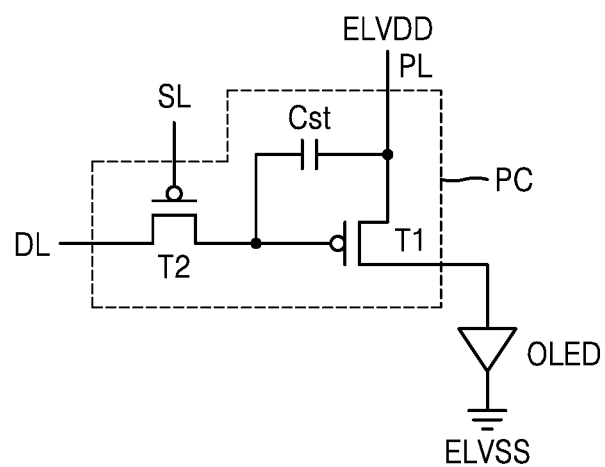
FIG. 2 is a schematic diagram illustrating a display element and a pixel circuit connected thereto, the pixel circuit being arranged in one of the pixel areas of a display device according to an exemplary embodiment of the present disclosure.

FIG. 2 is a schematic diagram illustrating a display element and a pixel circuit PC connected thereto, the pixel circuit PC being arranged in one of the pixel areas of a display device according to an exemplary embodiment of the present disclosure.

Referring to FIG. 2, an organic light-emitting diode OLED, which is a display element, is connected to the pixel circuit PC. The pixel circuit PC may include a first thin film transistor T1, a second thin film transistor T2, and a storage capacitor Cst. The organic light-emitting diode OLED may emit red, green, and blue light, or may emit red, green, blue, and white light.

The second thin film transistor T2 includes a switching thin film transistor and is connected to a scan line SL and a data line DL. The second thin film transistor T2 transfers a data voltage input through the data line DL to the first thin film transistor T1 in response to a switching voltage input through the scan line SL. The storage capacitor Cst may be connected to the second thin film transistor T2 and a driving voltage line PL and may cary a voltage corresponding to a difference between a voltage transferred from the second thin film transistor T2 and a first power voltage ELVDD supplied through the driving voltage line PL.

The first thin film transistor T1 may be a driving thin film transistor, be connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a predetermined brightness according to the driving current. An opposite electrode (e.g. a cathode) of the organic light-emitting diode OLED may receive a second power voltage ELVSS.

Though it is described in FIG. 2 that the pixel circuit PC includes two thin film transistors and one storage capacitor, the number of thin film transistors and the number of storage capacitors may be variously changed depending on a design of the pixel circuit PC.

Figure 3:
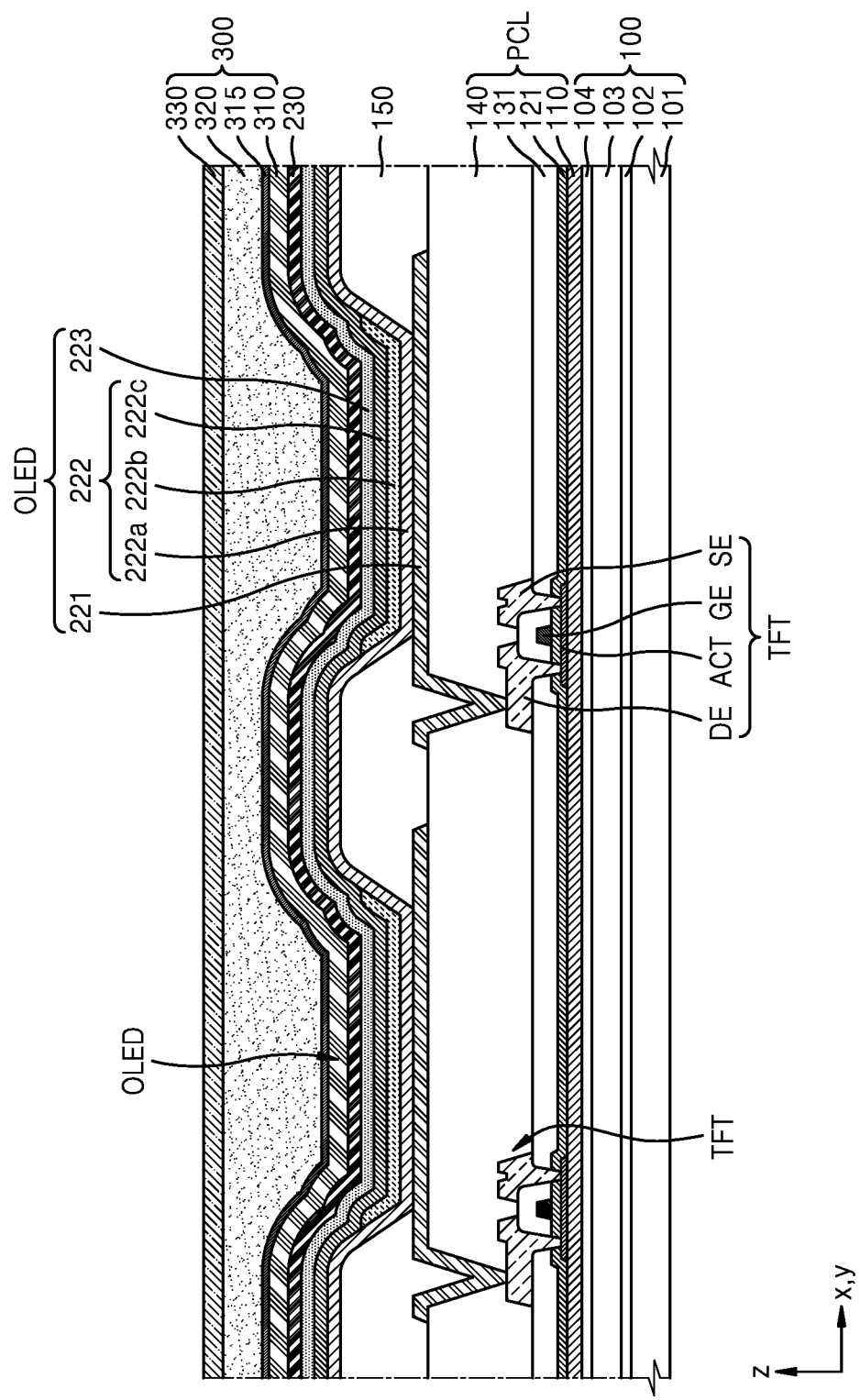
FIG. 3 is a cross-sectional view illustrating a portion of a display device according to an exemplary embodiment of the present disclosure.
Figure 4:
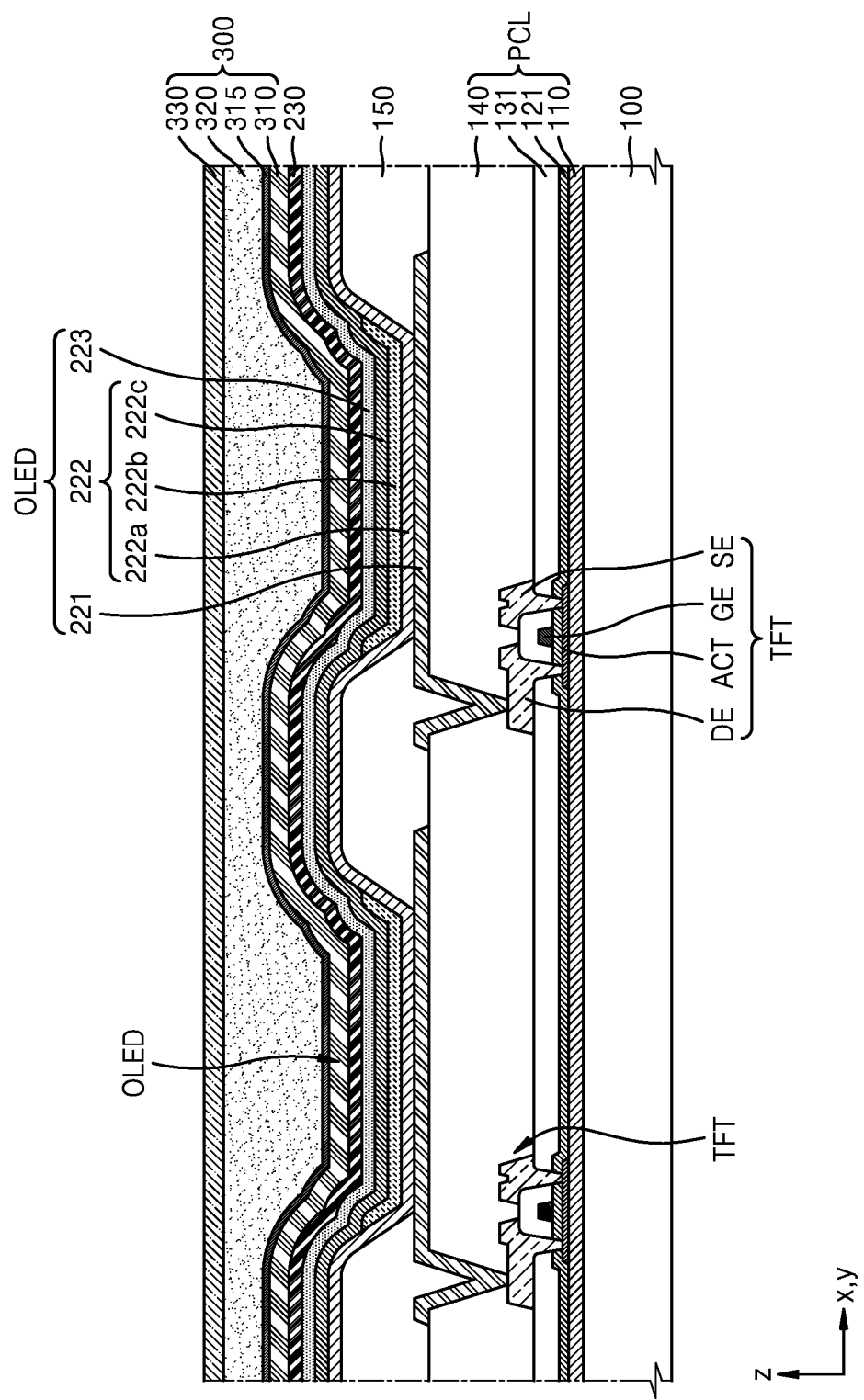
FIG. 4 is a cross-sectional view illustrating a portion of a display device according to an exemplary embodiment of the present disclosure.

FIGS. 3 and 4 are cross-sectional views illustrating a portion of a display device according to an exemplary embodiment of the present disclosure.

Referring to FIGS. 3 and 4, a pixel circuit layer PCL is arranged on the substrate 100, and the organic light-emitting diode OLED, which is a display element, is arranged on the pixel circuit layer PCL and is covered by a thin-film encapsulation layer 300. The pixel circuit layer PCL includes the pixel circuit PC.

The substrate 100 may include a glass material or a polymer resin. The substrate 100 including a polymer resin may be flexible, rollable, and/or bendable.

In an exemplary embodiment of the present disclosure, the substrate 100 may include a first base layer 101, a first barrier layer 102, a second base layer 103, and a second barrier layer 104 as shown in FIG. 3. The first base layer 101 and the second base layer 103 may include a polymer resin. For example, the first base layer 101 and the second base layer 103 may include a polymer resin including polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose tri acetate (TAC) and/or cellulose acetate propionate (CAP). The first barrier layer 102 and the second barrier layer 104 are barrier layers preventing the penetration of external foreign substances and may include a single layer or a multi-layer structure including an inorganic material such as silicon nitride and silicon oxide.

According to an exemplary embodiment of the present disclosure, the substrate 100 may include a single layer including a glass material as shown in FIG. 4. For example, the substrate 100 may include a glass substrate including $SiO_2$ as a main component thereof.

The pixel circuit layer PCL on the substrate 100 may include a thin film transistor TFT. The pixel circuit layer PCL may include a storage capacitor connected to the thin film transistor TFT. The transistor TFT may have the same structure for each pixel. Each thin film transistor TFT may be connected to a display element provided to each pixel.

The thin film transistor TFT may include a semiconductor layer Act, a gate electrode GE, a source electrode SE, and a drain electrode DE. The semiconductor layer Act includes amorphous silicon, polycrystalline silicon, and/or an organic semiconductor material. To secure insulation between the semiconductor layer Act and the gate electrode GE, a gate insulating layer 121 may be arranged between the semiconductor layer Act and the gate electrode GE. The gate insulating layer 121 includes an inorganic material such as silicon oxide, silicon nitride, and/or silicon oxynitride. An interlayer insulating layer 131 may be arranged on the gate electrode GE. The interlayer insulating layer 131 includes an inorganic material such as silicon oxide, silicon nitride, and/or silicon oxynitride. The source electrode SE and the drain electrode DE may each be arranged on the interlayer insulating layer 131. The insulating layer includes an inorganic material that may be formed by chemical vapor deposition (CVD) and/or atomic layer deposition (ALD).

The gate electrode GE, the source electrode SE, and the drain electrode DE may include various conductive materials. The gate electrode GE may include molybdenum or aluminum and may have a single-layered or multi-layered structure. For example, the gate electrode GE may include a single molybdenum layer, or may have a three-layered structure including a molybdenum layer, an aluminum layer, and a molybdenum layer. The source electrode SE and the drain electrode DE may each include titanium or aluminum and may each have a single-layered or multi-layered structure. In an exemplary embodiment of the present disclosure, the source electrode SE and the drain electrode DE may each have a three-layered structure including a titanium layer, an aluminum layer, and a titanium layer.

A buffer layer 110 may be arranged between the thin film transistor TFT having the above-described structure and the substrate 100. The buffer layer 110 includes an inorganic material such as silicon oxide, silicon nitride, and/or silicon oxynitride. The buffer layer 110 may increase flatness of a top surface of the substrate 100 or may prevent or minimize the penetration of impurities into the semiconductor layer Act of the thin film transistor TFT from the substrate 100.

A planarization insulating layer 140 may be arranged on the thin film transistor TFT. The planarization insulating layer 140 may include an organic material such as acryl, benzocyclobutene (BCB), or hexamethyldisiloxane (HMDSO). The planarization insulating layer 140 may be a single layer or the planarization insulating layer 140 may be a multi-layer structure.

The organic light-emitting diode OLED includes a pixel electrode 221, an intermediate layer 222, and an opposite electrode 223.

The pixel electrode 221 may be arranged on the planarization insulating layer 140 and may be arranged one-by-one for every pixel. The pixel electrode 221 may include a reflective electrode. In an exemplary embodiment of the present disclosure, the pixel electrode 221 may include a reflective layer including Ag, Mg, Al, Pt, Pd, Au, Ni, Nd, Ir, and/or Cr. In an exemplary embodiment of the present disclosure, the pixel electrode 221 may include a transparent or semi-transparent electrode layer arranged on/under the reflective layer. The transparent or semi-transparent electrode layer may include indium tin oxide (ITO), indium zinc oxide (IZO), zinc oxide (ZnO), indium oxide ($In_2O_3$), indium gallium oxide (IGO), and/or aluminum zinc oxide (AZO). In an exemplary embodiment of the present disclosure, a pixel electrode 221 may have a three-layered structure of an ITO layer, an Ag layer, and an ITO layer.

A pixel-defining layer 150 is arranged on the pixel electrode 221. The pixel-defining layer 150 includes an opening 150OP exposing a central portion of each pixel electrode 221. The pixel-defining layer 150 may prevent an arc, etc. from occurring at the edges of the pixel electrode 221 by increasing a distance between the opposite electrode 223 and the edges of the pixel electrode 221. The pixel-defining layer 150 may include an organic insulating material such as polyimide, polyamide, an acrylic resin, BCB, HMDSO, and a phenolic resin, and may be formed by a method such as spin coating.

An emission layer 222b may be arranged on a portion of the pixel electrode 221 that is exposed through the opening 150OP of the pixel-defining layer 150. The emission layer 222b may include an organic material including a fluorescent or phosphorous material that may emit red, green, or blue light. The organic material may include a low molecular weight organic material or a polymer organic material.

A first functional layer 222a and a second functional layer 222c may be respectively arranged under and on the emission layer 222b. The first functional layer 222a may include, for example, a hole transport layer (HTL), or include an HTL as well as a hole injection layer. The second functional layer 222c is an element arranged on the emission layer 222b and may include an electron transport layer (ETL) and/or an electron injection layer (EIL). The second functional layer 222c is optional and may be omitted. In an exemplary embodiment of the present inventive concept, the second functional layer 222c may be omitted.

The emission layers 222b are arranged so as to respectively correspond to openings of the pixel-defining layer 150.

In contrast, like the opposite electrode 223 described below, the first functional layer 222a and the second functional layer 222c may be common layers each formed as one body so as to entirely cover the substrate 100, for example, so as to entirely cover the display area DA of the substrate 100.

The opposite electrode 223 may include a (semi) transparent layer including Ag, Mg, Al, Pt, Pd, Au, Ni, Nd, Ir, Cr, Li, and/or Ca. Alternatively, the opposite electrode 223 may further include a layer including ITO, IZO, ZnO, and/or $In_2O_3$ on the (semi) transparent layer including the above materials. In an exemplary embodiment of the present disclosure, the opposite electrode 223 may include Ag, Mg, or an alloy of Ag and Mg.

A capping layer 230 may be located on the opposite electrode 223. For example, the capping layer 230 may include LiF, an inorganic insulating material, or an organic insulating material. In an exemplary embodiment of the present disclosure, the capping layer 230 may be omitted.

The thin-film encapsulation layer 300 may include at least one inorganic encapsulation layer and at least one organic encapsulation layer. For example, the thin-film encapsulation layer 300 includes a first inorganic encapsulation layer 310, an organic encapsulation layer 320, and a second inorganic encapsulation layer 330, and includes an auxiliary layer 315 between the first inorganic encapsulation layer 310 and the organic encapsulation layer 320, as shown in FIG. 4.

The first inorganic encapsulation layer 310 and the second inorganic encapsulation layer 330 may include an inorganic insulating material such as aluminum oxide, titanium oxide, tantalum oxide, hafnium oxide, zinc oxide, silicon oxide, silicon nitride, and/or silicon oxynitride. In an exemplary embodiment of the present disclosure, the first inorganic encapsulation layer 310 and the second inorganic encapsulation layer 330 may each include an inorganic insulating layer including a non-metal element, for example, silicon oxide, silicon nitride, and/or silicon oxynitride. The number and a kind of non-metal elements included in the first inorganic encapsulation layer 310 may be different from the number and a kind of non-metal elements included in the second inorganic encapsulation layer 330. For example, the first inorganic encapsulation layer 310 may include silicon oxynitride, and the second inorganic encapsulation layer 330 may include silicon nitride.

The first inorganic encapsulation layer 310 may have a thickness T ranging from about 600 nm to about 2200 nm (600 nm≤T≤2200 nm). In the case where the thickness of the first inorganic encapsulation layer 310 deviates from the lower limit (for example, less than 600 nm), moisture transmission may occur. In the case where the thickness of the first inorganic encapsulation layer 310 deviates from the upper limit, the first inorganic encapsulation layer 310 may exfoliate or separate. A thickness of the second inorganic encapsulation layer 330 may be the same as, less than, or greater than the thickness of the first inorganic encapsulation layer 310.

The organic encapsulation layer 320 may alleviate inner stress of the first inorganic encapsulation layer 310 and/or the second inorganic encapsulation layer 330. The organic encapsulation layer 320 may include a polymer-based material. The polymer-based material may include PET, PEN, PC, PI, polyethylene sulfonate, polyoxymethylene, polyarylate, HMDSO, an acrylic-based resin (for example, polymethylmethacrylate, poly acrylic acid, etc.), or an arbitrary combination thereof.

The organic encapsulation layer 320 may be formed by coating with a monomer having fluidity and then hardening a monomer layer by using heat or light such as an ultraviolet ray. Alternatively, the organic encapsulation layer 320 may be formed by coating with a polymer-based material.

The auxiliary layer 315 is arranged between the first inorganic encapsulation layer 310 and the organic encapsulation layer 320. The auxiliary layer 315 may directly contact the first inorganic encapsulation layer 310 and the organic encapsulation layer 320. For example, a bottom surface of the auxiliary layer 315 may directly contact a top surface of the first inorganic encapsulation layer 310, and a top surface of the auxiliary layer 315 may directly contact a bottom surface of the organic encapsulation layer 320.

The auxiliary layer 315 may include an inorganic insulating layer including a non-metal element. In an exemplary embodiment of the present disclosure, a non-metal element included in the auxiliary layer 315 may be the same non-metal element as that of the first inorganic encapsulation layer 310. The non-metal element may include, for example, Si, O, and/or N.

Light emitted from an organic light-emitting diode OLED arranged for each pixel passes through the thin-film encapsulation layer 300 and progresses to the outside. In this case, due to a thin-film interference phenomenon of the thin-film encapsulation layer 300, an image viewed by the user may seem reddish (e.g. each color may look more red than it should) when the image is viewed in an oblique direction with respect to a direction (e.g. a z-direction) perpendicular to the substrate 100 (e.g. when viewed from a side angle as opposed to straight on). However, since the thin-film encapsulation layer 300 includes the auxiliary layer 315, the reddish image issue may be prevented. A specific characteristic of the thin-film encapsulation layer 300 is described below with reference to FIG. 5.

Figure 5:
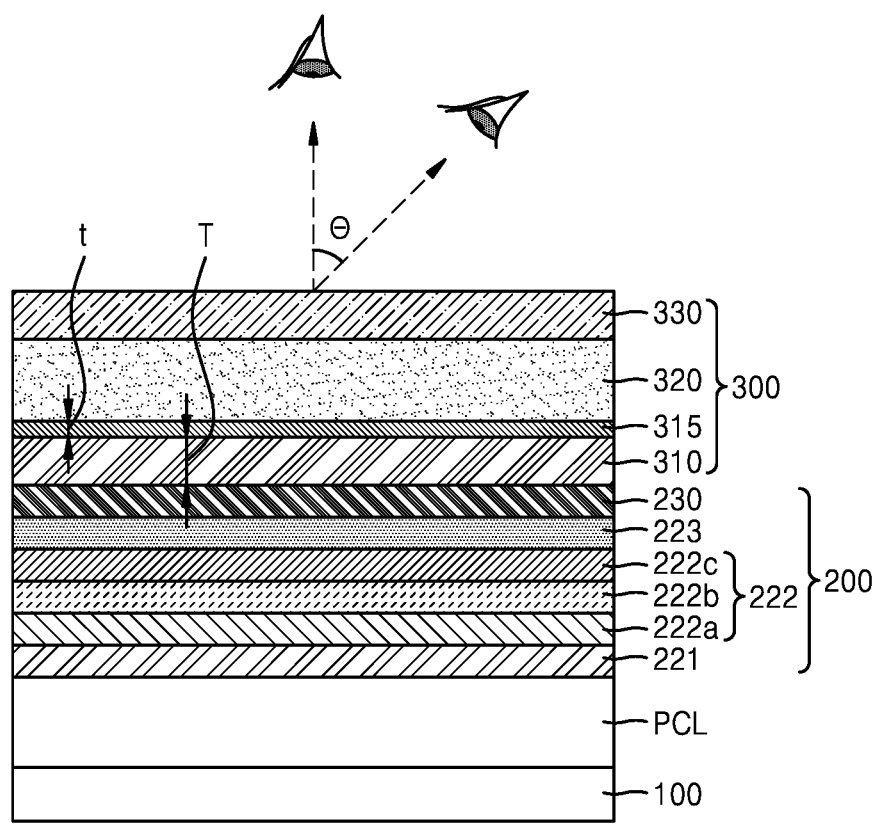
FIG. 5 is a cross-sectional view illustrating a display device according to an exemplary embodiment of the present disclosure.

FIG. 5 is a cross-sectional view illustrating the display device 10 according to an exemplary embodiment of the present disclosure.

Referring to FIG. 5, the display device 10 includes the substrate 100, the pixel circuit layer PCL, a display layer 200, and the thin-film encapsulation layer 300 that are sequentially stacked. The display layer 200 includes the pixel electrode 221, the intermediate layer 222, the opposite electrode 223, and the capping layer 230.

The thin-film encapsulation layer 300 may include the first inorganic encapsulation layer 310 and the auxiliary layer 315 that are sequentially stacked in a progressing direction of light (or a direction facing the thin-film encapsulation layer 300 from the display layer 200). The organic encapsulation layer 320 and the second inorganic encapsulation layer 330 may be arranged on the auxiliary layer 315.

Though a method of adjusting a thickness of the first inorganic encapsulation layer 310 may be considered as a method of resolving the above-mentioned reddish issue, it might not be easy to control the thickness thereof due to the limitations of the manufacturing equipment being used (e.g. CVD equipment) for forming the first inorganic encapsulation layer 310. For example, the first inorganic encapsulation layer 310 may have a thickness ranging from about 600 nm to about 2200 nm, as described above, so as to protect the display layer 200 from moisture, etc. and to prevent the separation of the first inorganic encapsulation layer 310. In the case where a margin for error of equipment for forming an inorganic insulating layer is about 10%, since a thickness deviation of the first inorganic encapsulation layer 310 that is actually formed corresponds to the range from tens of nm to hundreds of nm, it is practically difficult to control the thickness of the first inorganic encapsulation layer 310 and thus there is a limit in resolving the above-described reddish issue.

The thin-film encapsulation layer 300, according to an exemplary embodiment of the present disclosure, has an advantage of easily solving the reddish issue without being limited by the thickness of the first inorganic encapsulation layer 310, by arranging the auxiliary layer 315 on the first inorganic encapsulation layer 310.

The auxiliary layer 315 may include an inorganic insulating material. To minimize or prevent the reddish issue, a thickness t of the auxiliary layer 315 may be less than about 100 nm. For example, the thickness t of the auxiliary layer 315 may be equal to or greater than 30 nm and less than 100 nm (30 nm≤t<100 nm).

Figure 6:
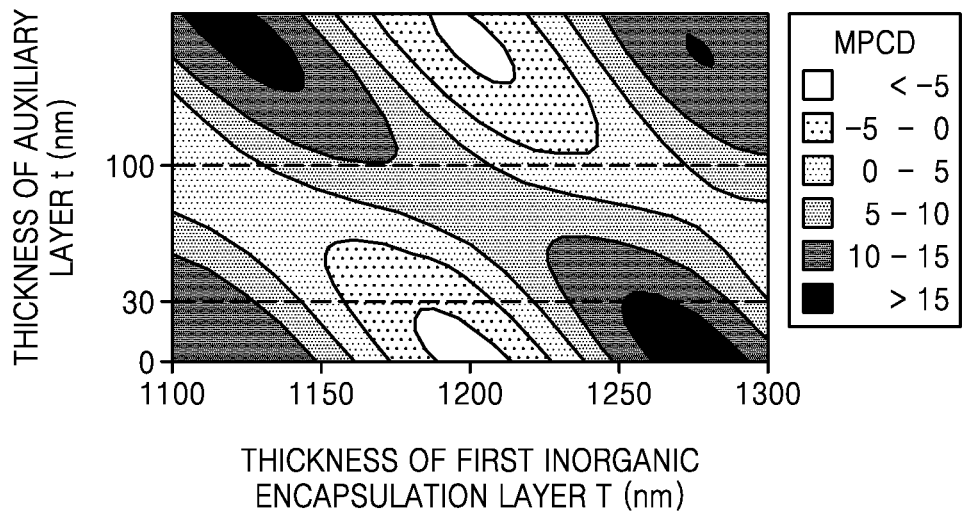
FIG. 6 is a graph illustrating simulation results showing minimum perception color difference (MPCD) depending on a thickness change of a first inorganic encapsulation layer and a thickness change of an auxiliary layer.

FIG. 6 is a graph illustrating a minimum perception color difference (MPCD) depending on a thickness change of the first inorganic encapsulation layer 310 and a thickness change of the auxiliary layer 315. In FIG. 6, the MPCD is shown as a contour by dividing a predetermined section. When an MPCD has a (−) value in a direction away from zero, the MPCD represents reddish. When MPCD has a (+) value in a direction away from zero, the MPCD represents greenish. FIG. 6 shows simulation results in the case where the first inorganic encapsulation layer 310 and the auxiliary layer 315 respectively include silicon oxynitride layers having different refractive indexes. The contour of the MPCD is shown based on MPCD values when the display device 10 is viewed in an oblique direction with respect to a direction perpendicular to the substrate 100, for example, when viewed at an oblique angle of about 30° (θ=30°) with respect to a z-direction, as shown in FIG. 5.

Referring to FIG. 6, it is found that a change in the MPCD is small when the thickness t of the auxiliary layer 315 is in the range of 30 nm≤t<100 nm. When the thickness of the auxiliary layer 315 meets the above-described range, the reddish issue may be minimized or prevented without being limited by the thickness T of the first inorganic encapsulation layer 310.

The auxiliary layer 315 may include an inorganic insulating material. In the inorganic insulating material formed by CVD equipment, a thickness of the inorganic insulating material that is actually formed may have an error of about 10% compared to a target thickness as described above. Since, like the first inorganic encapsulation layer 310, the auxiliary layer 315 may be formed by using CVD equipment, a thickness of the auxiliary layer 315 that is actually formed may be different from a target thickness. However, since a thickness of the auxiliary layer 315 is one tenth of the thickness of the first inorganic encapsulation layer 310, or smaller, controlling a thickness of the auxiliary layer 315 is much easier even though a thickness error (e.g. an error of about 10%) of the CVD equipment is taken into account.

In the case where the auxiliary layer 315 deviates from the above-described thickness range, for example, deviates from the lower limit, a change in an MPCD increases. In the case where the auxiliary layer 315 deviates from the upper limit, a change in an MPCD increases and/or it is difficult to control the thickness of the auxiliary layer 315. Therefore, it is difficult to expect the auxiliary layer 315 to prevent the reddish issue without being limited by the thickness of the first inorganic encapsulation layer 310.

As described above, the auxiliary layer 315 may include an inorganic insulating material including a non-metal element. In an exemplary embodiment of the present disclosure, the auxiliary layer 315 may include the same non-metal element as that of the first inorganic encapsulation layer 310. For example, the auxiliary layer 315 and the first inorganic encapsulation layer 310 may each include Si, O, and N. Therefore, the first inorganic encapsulation layer 310 and the auxiliary layer 315 may be formed by changing composition of a gas in the same CVD equipment (or the same chamber). For example, the auxiliary layer 315 and the first inorganic encapsulation layer 310 may include silicon nitride layers having different Si, O, and N contents/concentrations. A gas composition during a process of forming the first inorganic encapsulation layer 310 may be different from a gas composition during a process of forming the auxiliary layer 315. Therefore, there may be an interface between them, as shown in FIG. 5.

The first inorganic encapsulation layer 310 and the auxiliary layer 315 may have different refractive indexes. For example, a refractive index n3 of the auxiliary layer 315 may meet the condition below.

$$\min(n1,n2)+|n2-n1|\times 0.25 < n3 < \min(n1,n2)+|n2-n1|\times 0.75$$

Here, n1 is a refractive index of the first inorganic encapsulation layer 310, n2 is a refractive index of the organic encapsulation layer 320, and min (n1, n2) is a minimum value of n1 and n2, and |n2−n1| is an absolute value of a difference between n2 and n1.

In the case where the refractive index n3 of the auxiliary layer 315 deviates from the above range, the MPCD may change substantially and thus it is difficult to prevent the reddish issue.

Figure 7:
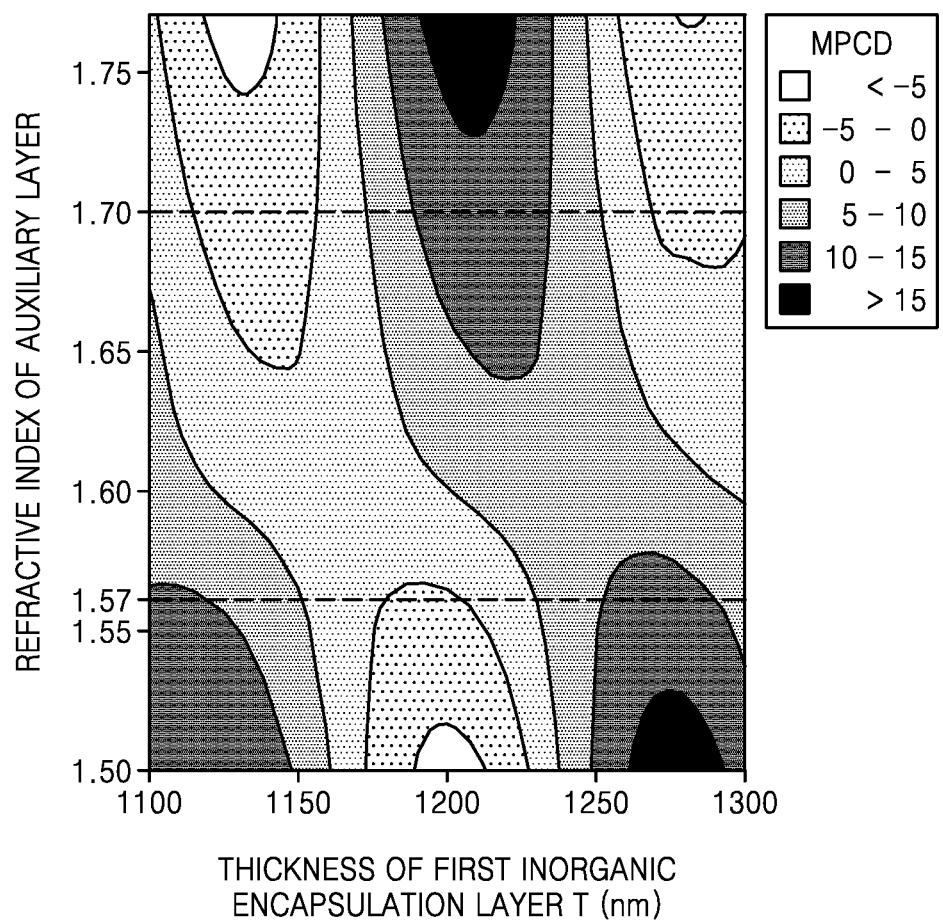
FIG. 7 is a graph illustrating simulation results showing MPCD depending on a thickness change of a first inorganic encapsulation layer and a refractive index change of an auxiliary layer.

FIG. 7 is a graph illustrating an MPCD depending on a thickness change of the first inorganic encapsulation layer 310 and a refractive index change of the auxiliary layer 315. Like in FIG. 6, the MPCD is simulation results in the case where the first inorganic encapsulation layer 310 and the auxiliary layer 315 respectively include silicon oxynitride layers and the display device 10 is viewed at a location that is oblique with respect to a direction perpendicular to the substrate 100, for example, when viewed at an oblique angle of about 30° (θ=30°) with respect to a z-direction of FIG. 5. Referring to FIG. 7, in the case where a refractive index of the auxiliary layer 315 is in the range from about 1.57 to about 1.70, a change in the MPCD is relatively small. A refractive index of the auxiliary layer 315 may be less than a refractive index of the first inorganic encapsulation layer 310.

Figure 8:
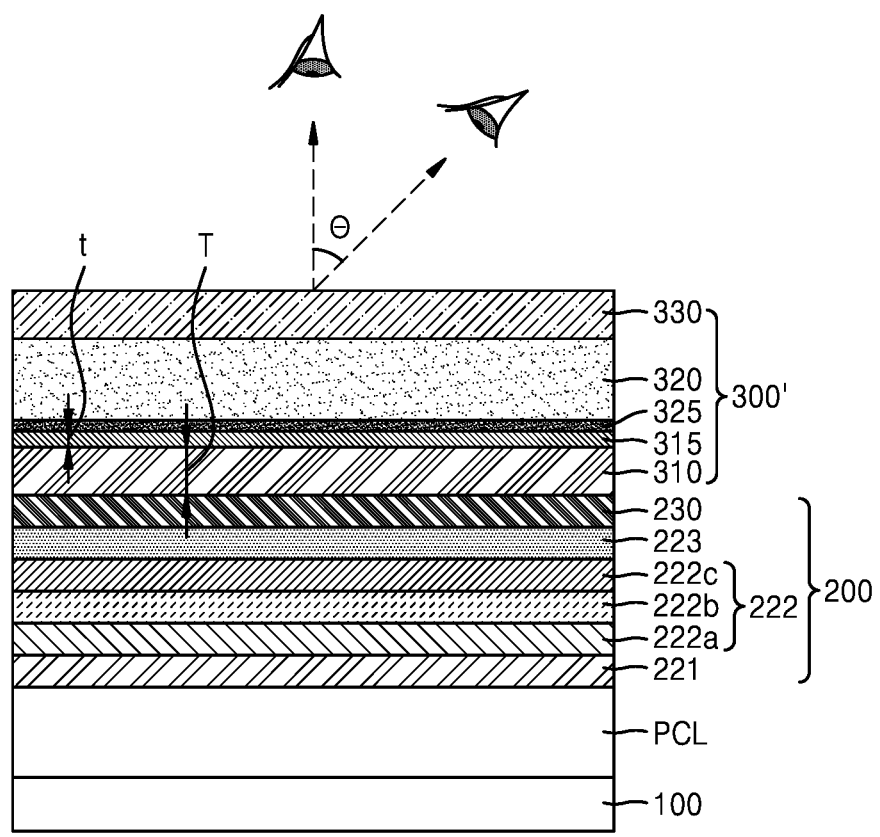
FIG. 8 is a block diagram illustrating a display device according to an exemplary embodiment of the present disclosure.

FIG. 8 is a block diagram of the display device 10 according to an exemplary embodiment of the present disclosure.

Referring to FIG. 8, the display device 10 may include the substrate 100, the pixel circuit layer PCL, the display layer 200, and a thin-film encapsulation layer 300'. The thin-film encapsulation layer 300' may further include a bottom layer 325 arranged under the organic encapsulation layer 320. Since the rest of the elements except for the bottom layer 325 are the same as those of the embodiment described with reference to FIGS. 5 to 7, the bottom layer 325 is mainly described below.

The bottom layer 325 need not function as a thin-film encapsulation layer, for example, it might transmit moisture. The bottom layer 325 may control a material constituting the organic encapsulation layer 320 during a process of forming the organic encapsulation layer 320 by coating and hardening a monomer. As described above, the bottom layer 325 does not only have a moisture transmission characteristic but also has a separate optical function. A refractive index of the bottom layer 325 may be substantially the same as a refractive index of the organic encapsulation layer 320. Because the refractive index of the bottom layer 325 may be substantially the same as the refractive index of the organic encapsulation layer 320, a difference Δn between the refractive index of the bottom layer 325 and the refractive index of the organic encapsulation layer 320 is less than 0.05. In an exemplary embodiment of the present disclosure, the refractive index of the bottom layer 325 may be about 1.52. A thickness of the bottom layer 325 may be in the range from about 500 Å to about 1000 Å. For example, the thickness of the bottom layer 325 may be within a range from about 550 Å to about 900 Å, or from about 600 Å to about 850 Å. Because a refractive index of the bottom layer 325 is substantially the same as a refractive index of the organic encapsulation layer 320, with the bottom layer 325 including a different material from that of the organic encapsulation layer 320, there is an interface between the bottom layer 325 and the organic encapsulation layer 320.

The bottom layer 325 may include an inorganic insulating layer. In an exemplary embodiment of the present disclosure, the bottom layer 325 may include the same non-metal element as those of the first inorganic encapsulation layer 310 and the auxiliary layer 315, or may include a non-metal element different from a non-metal element included in the first inorganic encapsulation layer 310 and the auxiliary layer 315. For example, the bottom layer 325 may include an inorganic insulating layer having relatively high oxygen content, for example, the bottom layer 325 may include an oxygen rich silicon oxynitride layer.

In an exemplary embodiment of the present disclosure, each of the first inorganic encapsulation layer 310, the auxiliary layer 315, and the bottom layer 325 may include the same non-metal element, for example, Si, O, and N. A first silicon oxynitride layer as the first inorganic encapsulation layer 310, a second silicon oxynitride layer as the auxiliary layer 315, and a third silicon oxynitride layer as the bottom layer 325, may respectively include different Si, O, and No content ratios and/or concentrations. Therefore, there may be interfaces between the first silicon oxynitride layer and the second silicon oxynitride layer, and between the second silicon oxynitride layer and the third silicon oxynitride layer.

Figure 9:
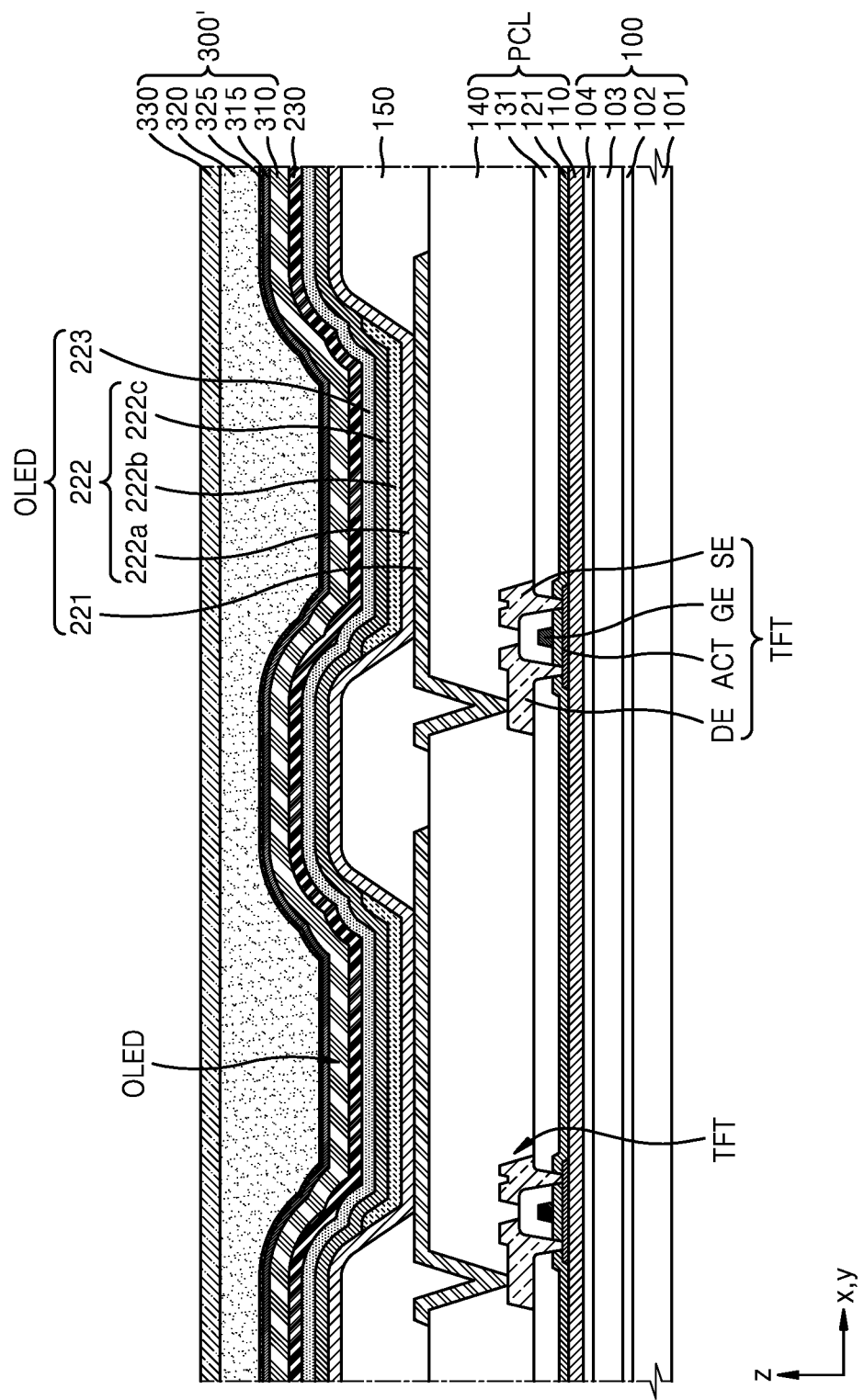
FIG. 9 is a cross-sectional view illustrating a portion of a display device according to an exemplary embodiment of the present disclosure.

FIG. 9 is a cross-sectional view illustrating a portion of the display device 10 according to an exemplary embodiment of the present disclosure.

Referring to FIG. 9, an organic light-emitting diode OLED, as a display element, is arranged in each pixel of the substrate 100. Each organic light-emitting diode OLED may be electrically connected to a thin film transistor TFT provided to the pixel circuit layer PCL. The substrate 100, the pixel circuit layer PCL, and the organic light-emitting diode OLED may be the same as those described above with reference to FIG. 3.

The organic light-emitting diode OLED for each pixel may be covered by the thin-film encapsulation layer 300'. The thin-film encapsulation layer 300' may include the first inorganic encapsulation layer 310, the auxiliary layer 315, the bottom layer 325, the organic encapsulation layer 320, and the second inorganic encapsulation layer 330 that are sequentially stacked in a direction (e.g. the z-direction) away from the substrate 100, for example, in the recited order. The first inorganic encapsulation layer 310, the auxiliary layer 315, the bottom layer 325, the organic encapsulation layer 320, and the second inorganic encapsulation layer 330 may be the same as those described with reference to FIGS. 3 to 8.

The first inorganic encapsulation layer 310, the auxiliary layer 315, and the bottom layer 325 may include different non-metal elements or the same non-metal elements. The non-metal element may include, for example, Si, O, and N.

In an exemplary embodiment of the present disclosure, the first inorganic encapsulation layer 310, the auxiliary layer 315, and the bottom layer 325 may each include a silicon oxynitride layer including Si, O, and N. However, characteristics, for example, refractive indexes of the first inorganic encapsulation layer 310, the auxiliary layer 315, and the bottom layer 325 may be different from one another. The third silicon oxynitride layer as the bottom layer 325 has a relatively high oxygen content (e.g. is oxygen rich), and a refractive index of the third silicon oxynitride layer may be less than refractive indexes of the first silicon oxynitride layer as the first inorganic encapsulation layer 310 and the second silicon oxynitride layer as the auxiliary layer 315.

Even though the first inorganic encapsulation layer 310, the auxiliary layer 315, and the bottom layer 325 each include the same non-metal elements, they are formed during separate processes. A process of forming the first inorganic encapsulation layer 310, a process of forming the auxiliary layer 315, and a process of forming the bottom layer 325 are sequentially performed in separate processes (e.g. with different ratios of a reaction gas or with different kinds of a reaction gas in the same chamber). The auxiliary layer 315 is arranged right on the first inorganic encapsulation layer 310, and the bottom layer 325 is arranged right on the auxiliary layer 315. There are interfaces between the first inorganic encapsulation layer 310 and the auxiliary layer 315 and between the auxiliary layer 315 and the bottom layer 325. These interfaces may be visible to an observer, in a cross-sectional view.

A process of forming the organic encapsulation layer 320 may be performed after the process of forming the bottom layer 325. A process of forming the second inorganic encapsulation layer 330 may be performed after the process of forming the organic encapsulation layer 320. Therefore, the bottom layer 325 and the organic encapsulation layer 320 contact each other and a contact surface therebetween is visible to an observer on a cross-sectional view. Likewise, the organic encapsulation layer 320 and the second inorganic encapsulation layer 330 contact each other, and a contact surface therebetween is visible to an observer on a cross-sectional view.

Though it is described in FIG. 9 that the substrate 100 includes a polymer resin, the substrate 100 shown in FIG. 9 may alternatively include a glass material described with reference to FIG. 4.

FIGS. 10A to 10D are graphs showing MPCD depending on a viewing angle θ in accordance with exemplary embodiments of the present disclosure. FIGS. 10E and 10F are graphs showing MPCD depending on a viewing angle θ in accordance with comparative examples.

Figure 10A:
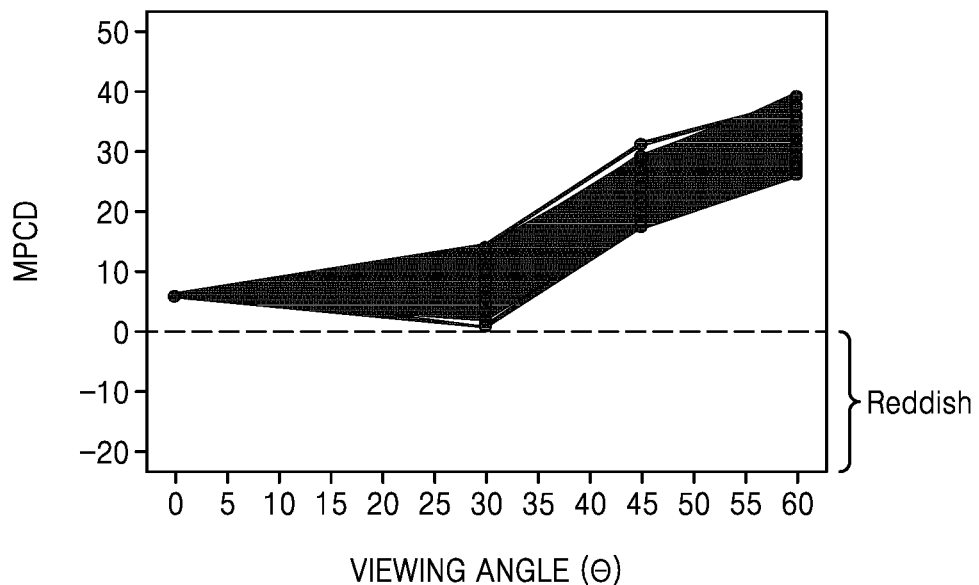
FIGS. 10A to 10D are graphs according to exemplary embodiments of the present disclosure, respectively, showing MPCD with respect to a viewing angle.

FIG. 10A shows results of an MPCD depending on a viewing angle θ after manufacturing two hundred samples in which the first inorganic encapsulation layer 310 includes a silicon oxynitride layer having a refractive index of about 1.77 and a thickness of about 1100 nm, and the auxiliary layer 315 includes a silicon oxynitride layer having a refractive index of about 1.62 and a thickness of about 70 nm.

Figure 10B:
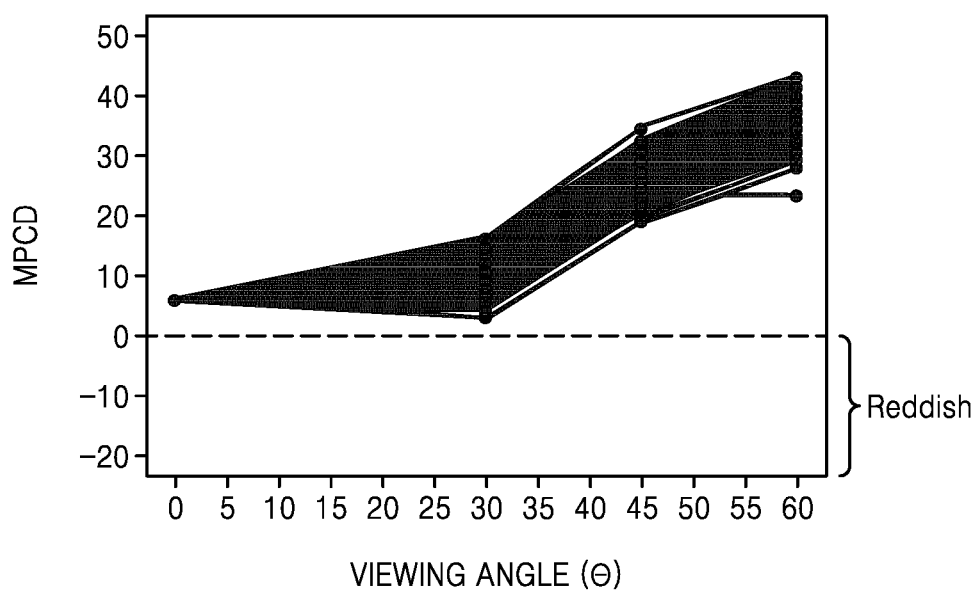

FIG. 10B shows results of an MPCD depending on a viewing angle after manufacturing two hundred samples in which the first inorganic encapsulation layer 310 includes a silicon oxynitride layer having a refractive index of about 1.77 and a thickness of about 1170 nm, and the auxiliary layer 315 includes a silicon oxynitride layer having a refractive index of about 1.62 and a thickness of about 70 nm.

Figure 10C:
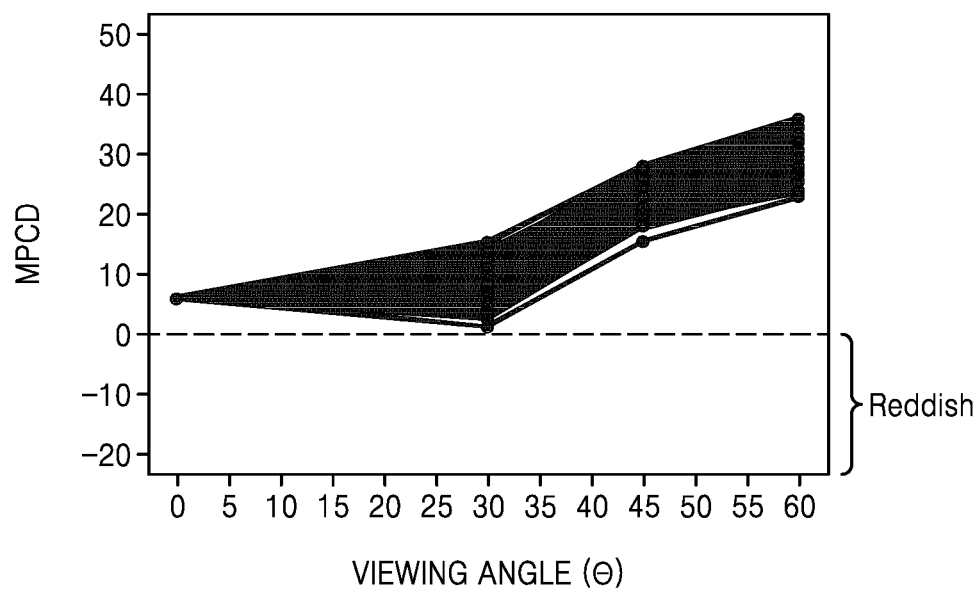

FIG. 10C shows results of an MPCD depending on a viewing angle θ after manufacturing two hundred samples in which the first inorganic encapsulation layer 310 includes a silicon oxynitride layer having a refractive index of about 1.77 and a thickness of about 900 nm, and the auxiliary layer 315 includes a silicon oxynitride layer having a refractive index of about 1.62 and a thickness of about 70 nm.

Figure 10D:
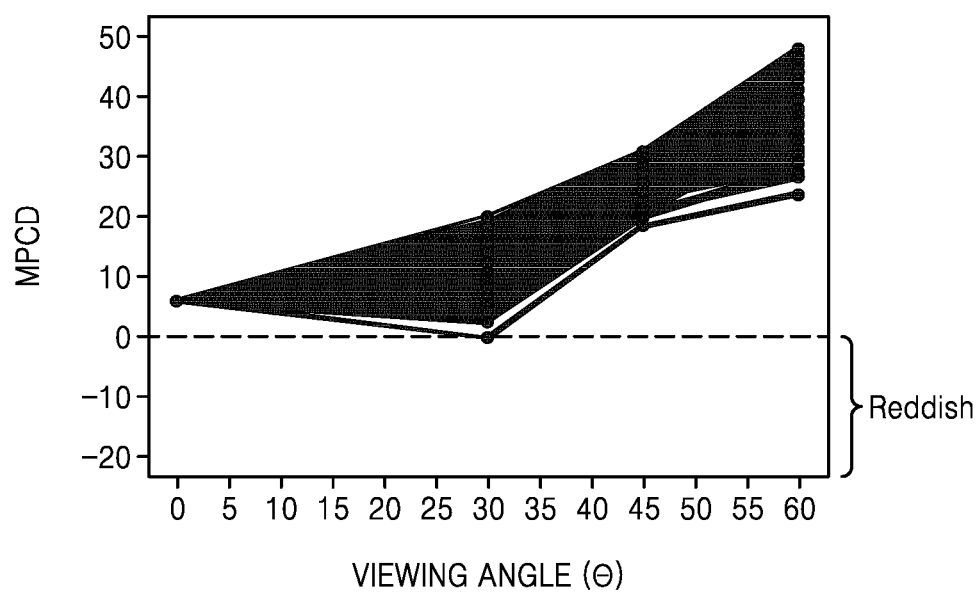
Figure 10E:
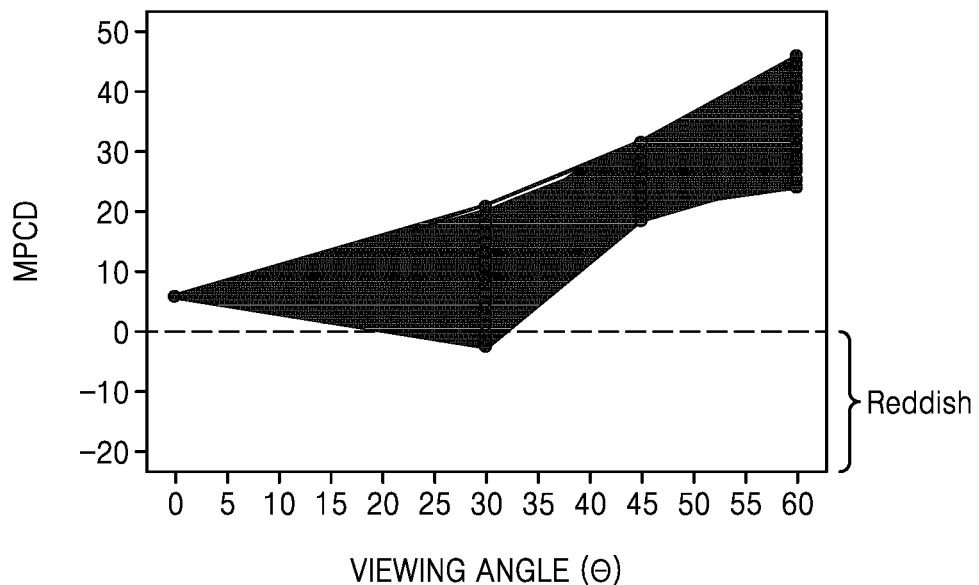
FIGS. 10E and 10F are graphs, according to comparative examples, respectively, showing MPCD with respect to a viewing angle.
Figure 10F:
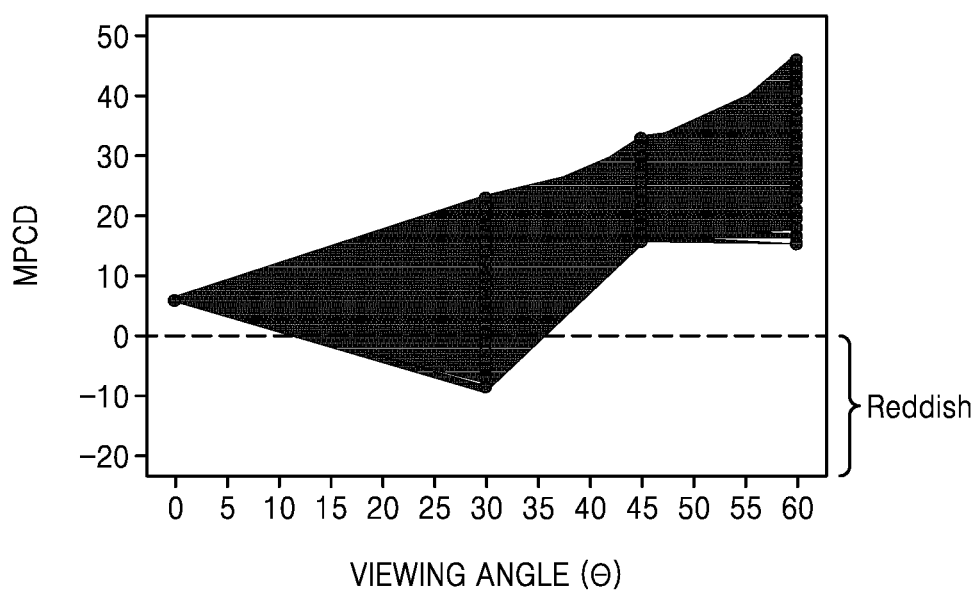

FIG. 10D shows results of an MPCD depending on a viewing angle θ after manufacturing two hundred samples in which the first inorganic encapsulation layer 310 includes a silicon oxynitride layer having a refractive index of about 1.77 and a thickness of about 1100 nm, and the auxiliary layer 315 includes a silicon oxynitride layer having a refractive index of about 1.62 and a thickness of about 40 nm.

FIG. 10E shows results of an MPCD depending on a viewing angle θ after manufacturing two hundred samples in which the first inorganic encapsulation layer 310 includes a silicon oxynitride layer having a refractive index of about 1.77 and a thickness of about 1100 nm, and the auxiliary layer 315 includes a silicon oxynitride layer having a refractive index of about 1.62 and a thickness of about 100 nm.

FIG. 10F shows results of an MPCD depending on a viewing angle θ after manufacturing two hundred samples in which the first inorganic encapsulation layer 310 includes a silicon oxynitride layer having a refractive index of about 1.77 and a thickness of about 1200 nm, and the auxiliary layer 315 is absent.

Information for each sample is summarized in Table 1 below.

TABLE 1

| | Thin-film encapsulation layer | |
| --- | --- | --- |
| | First inorganic encapsulation layer | Auxiliary layer |
| Embodiment #1 | SiON (n1: 1.77, T: 1100 nm) | SiON (n3: 1.62, t: 70 nm) |
| Embodiment #2 | SiON (n1: 1.77, T: 1170 nm) | SiON (n3: 1.62, t: 70 nm) |
| Embodiment #3 | SiON (n1: 1.77, T: 900 nm) | SiON (n3: 1.62, t: 70 nm) |
| Embodiment #4 | SiON (n1: 1.77, T: 1100 nm) | SiON (n3: 1.62, t: 40 nm) |
| Comparative example #1 | SiON (n1: 1.77, T: 1100 nm) | SiON (n3: 1.62, t: 100 nm) |
| Comparative example #2 | SiON (n1: 1.77, T: 1200 nm) | Not available |

Referring to FIGS. 10A to 10D and 10E and 10F, it is found that a reddish image is viewed at a viewing angle of 30° from the surface of the display in the case where a thickness of the auxiliary layer 315 is 100 nm or there is no auxiliary layer 315. It is found that the reddish issue is resolved in all of the embodiments in which the thickness range of the auxiliary layer 315 meets the above-described condition.

A display device according to exemplary embodiments of the present disclosure may prevent a color deviation of light emitted from display elements and encapsulate the display elements from external impurities while minimizing a thickness of the display device. However, the scope of the present disclosure is not limited by these effects.

It should be understood that embodiments described herein should be considered in a descriptive sense and various changes may be possible within the spirit and scope of the present disclosure. It is to be understood that the features and properties shown and described with respect to any one figure may be mixed and matched with the features and properties shown and described with respect to any other figure.

What is claimed is:

1. A display device comprising:
   a substrate;
   a display element disposed over the substrate;
   a first inorganic encapsulation layer disposed on the display element;
   an organic encapsulation layer disposed on the first inorganic encapsulation layer;
   an auxiliary layer disposed between the first inorganic encapsulation layer and the organic encapsulation layer, the auxiliary layer having a thickness less than about 100 nm and greater than 30 nm, and including an inorganic insulating material; and
   a second inorganic encapsulation layer disposed on the organic encapsulation layer.

2. The display device of claim 1, wherein a thickness of the first inorganic encapsulation layer is greater than or equal to 600 nm and less than or equal to 2200 nm.

3. The display device of claim 1, wherein the auxiliary layer directly contacts a top surface of the first inorganic encapsulation layer, and a refractive index n3 of the auxiliary layer meets the condition below:

$$\min(n1,n2)+|n2-n1|\times 0.25 < n3 < \min(n1,n2)+|n2-n1|\times 0.75,$$

where n1 is a refractive index of the first inorganic encapsulation layer, n2 is a refractive index of the organic encapsulation layer, min(n1, n2) is a minimum value of n1 and n2, and |n2−n1| is an absolute value of a difference between n2 and n1.

4. The display device of claim 1, wherein the first inorganic encapsulation layer and the auxiliary layer each include a non-metal element, wherein a non-metal element included in the first inorganic encapsulation layer is the same as a non-metal element included in the auxiliary layer.

5. The display device of claim 4, wherein the first inorganic encapsulation layer and the auxiliary layer each include silicon oxynitride, and a refractive index of the first inorganic encapsulation layer is different from a refractive index of the auxiliary layer.

6. The display device of claim 1, wherein the organic encapsulation layer directly contacts a top surface of the auxiliary layer.

7. The display device of claim 1, herein the auxiliary layer directly contacts the first inorganic encapsulation layer.

8. A display device comprising:
   a substrate;
   a display element disposed over the substrate;
   a first inorganic encapsulation layer disposed on the display element;
   an organic encapsulation layer disposed on the first inorganic encapsulation layer;
   an auxiliary layer disposed between the first inorganic encapsulation layer and the organic encapsulation layer, the auxiliary layer having a thickness less than about 100 nm, and including an inorganic insulating material;
   a second inorganic encapsulation layer disposed on the organic encapsulation layer; and
   a bottom layer disposed between the auxiliary layer and the organic encapsulation layer.

9. The display device of claim 8, wherein a difference between a refractive index of the bottom layer and a refractive index of the organic encapsulation layer is less than about 0.05.

10. The display device of claim 9, wherein the bottom layer includes an inorganic insulating material.

11. The display device of claim 10, wherein the bottom layer includes a non-metal element that is also included in the auxiliary layer.

12. The display device of claim 11, wherein
    the bottom layer and the auxiliary layer each include an inorganic insulating material including a silicon element, a nitrogen element, and an oxygen element, and
    an oxygen content of the bottom layer is greater than an oxygen content of the auxiliary layer.

13. A display device comprising:
    a substrate;
    a plurality of organic light-emitting diodes disposed over the substrate;
    a first inorganic encapsulation layer at least partially covering the plurality of organic light-emitting diodes;
    a second inorganic encapsulation layer disposed over the first inorganic encapsulation layer;
    an organic encapsulation layer disposed between the first inorganic encapsulation layer and the second inorganic encapsulation layer; and
    an auxiliary layer disposed between the first inorganic encapsulation layer and the organic encapsulation layer,
    wherein a thickness of the auxiliary layer is less than a thickness of the first inorganic encapsulation layer, is greater than or equal to 30 nm, and is less than 100 nm, and
    wherein the first inorganic encapsulation layer and the auxiliary layer each include silicon oxynitride, and a refractive index of the first inorganic encapsulation layer is different from a refractive index of the auxiliary layer.

14. The display device of claim 13, wherein a thickness of the first inorganic encapsulation layer is greater than or equal to 600 nm and less than 2200 nm.

15. The display device of claim 13, wherein the first inorganic encapsulation layer, the auxiliary layer, and the second inorganic encapsulation layer each include an inorganic insulating material including a non-metal element.

16. The display device of claim 15, wherein a refractive index n3 of the auxiliary layer meets the condition below:

$$\min(n1,n2)+|n2-n1|\times 0.25 < n3 < \min(n1,n2)+|n2-n1|\times 0.75,$$

where n1 is a refractive index of the first inorganic encapsulation layer, n2 is a refractive index of the organic encapsulation layer, min(n1, n2) is a minimum value of n1 and n2, and |n2−n1| is an absolute value of a difference between n2 and n1.

17. The display device of claim 15, wherein a non-metal element included in the first inorganic encapsulation layer is also included in the auxiliary layer, and a refractive index of the auxiliary layer is less than a refractive index of the first inorganic encapsulation layer.

18. The display device of claim 13, wherein the auxiliary layer, directly contacts the first inorganic encapsulation layer and the organic encapsulation layer.

19. The display device of claim 13, further comprising: a bottom layer disposed between the auxiliary layer and the organic encapsulation layer, wherein a difference between a refractive index of the bottom layer and a refractive index of the organic encapsulation layer is less than about 0.05.

20. The display device of claim 19, wherein the bottom layer includes an inorganic insulating material and the bottom layer directly contacts the auxiliary layer and the organic encapsulation layer.

\* \* \* \* \*